United States Patent [19]

Shibata et al.

[11] Patent Number: 5,132,751

[45] Date of Patent: Jul. 21, 1992

[54] LIGHT-EMITTING DIODE ARRAY WITH PROJECTIONS

[75] Inventors: Naoki Shibata, Yokohama; Teruo Sasagawa; Hirokazu Ohta, both of Kawasaki; Tadao Kazuno, Yokohama, all of Japan

[73] Assignee: Eastman Kodak Company, Rochester, N.Y.

[21] Appl. No.: 682,298

[22] Filed: Apr. 9, 1991

[30] Foreign Application Priority Data

Jun. 8, 1990 [JP] Japan .................................. 2-150491

[51] Int. Cl.5 ............................................ H01L 33/00
[52] U.S. Cl. .......................................... 357/17; 357/16; 357/45; 357/55; 357/52; 357/56; 372/48; 372/50
[58] Field of Search ........................ 357/17, 45, 16, 55, 357/56, 52, 52 T; 372/48, 50

[56] References Cited

U.S. PATENT DOCUMENTS

| 3,625,688 | 12/1971 | Velde | 357/17 X |
| 3,739,217 | 6/1973 | Bergh et al. | 357/17 X |
| 4,952,019 | 8/1990 | Evans et al. | 357/17 X |

FOREIGN PATENT DOCUMENTS

| 63-237467 | 10/1988 | Japan | 357/17X |

Primary Examiner—William Mintel
Attorney, Agent, or Firm—Raymond L. Owens

[57] ABSTRACT

A light-emitting diode array in which the light-emitting surface for external output of light from the light-emitting layer is processed to give it a slope, for example, which by increasing the critical angle of the internal reflection between the active layer and the air raises the external light output efficiency.

12 Claims, 2 Drawing Sheets

LIGHT-EMITTING DIODE ARRAY WITH PROJECTIONS

BACKGROUND OF THE INVENTION

1. Field of the Invention

The present invention relates to a light-emitting array comprising a multiplicity of light-emitting diodes closely arrayed on a single substrate for use as a light source such as the light source used to form an image in an optical printer.

2. Description of the Prior Art

A light-emitting diode (LED) array consists of multiple P-N or P-I-N junction LEDs fabricated on a single substrate. An advantage of such a light-emitting diode array is that it can be used to process image information with relative ease, by electrically controlling the discrete diodes of the array. Because of this, light-emitting diode arrays are being improved and applied in a variety of ways.

One example relates to the use of printers as hardcopy data output devices. With the increasing importance of electronic information in today's world, printers need to be able to print faster and at higher densities in order to cope not only with the growing amounts of information, but also with the inclusion of image information such as graphs, drawings and photographs. One way of achieving this is to use light-emitting diode arrays as the light sources in the printers.

Laser printers, which employ a laser light source, and LED printers, in which an LED array forms the light source, are examples of non-impact optical printers. In a laser printer the scanning by the laser beam is effected by mechanical means, such as a rotating polygonal mirror, and a correspondingly complex optical system. An LED printer, on the other hand, only requires a control system for switching the LEDs of the array on and off, and it is therefore possible for LED printers to be smaller and faster than laser printers, as well as more reliable.

FIG. 4 is a cross-sectional illustration of a conventional homojunction type LED array used in an LED printer. For simplicity, in the drawing only two light-emitting diodes (hereinafter also referred to as light-emitting elements) are shown. With reference to the FIG. 4, each light-emitting element is formed by the use of vapor-phase epitaxy (VPE) to deposit an n-GaAsP layer 12 about 15 microns thick on an n-GaAs substrate 10, followed by a SiN$_x$ masking layer 14 and a diffusion of zinc to form zinc diffused regions 16 each about 2.5 microns thick. The light-emitting element is constituted by the P-N junction between the n-GaAsP layer 12 and the zinc diffused regions 16. Next, p-electrode 18 and n-electrode 20 are formed, followed by an antireflection SiN$_x$ layer 22. This SiN$_x$ layer 22 is then removed from the non-light-emitting element portions to form a p-electrode 18 bonding pad.

Two problems arising when such a light-emitting diode array is used in a printer, and which are not encountered when individual LEDs are used, are crosstalk between adjacent light-emitting elements and variation in characteristics from element to element. Owing to internal light absorption and the high refractive index of the zinc diffused regions 16, most of the light is reflected and is therefore not available as external output, resulting in a very low external light output efficiency of no more than several percent.

In the conventional type of LED array shown in FIG. 4, the P-N junction being a homojunction formed by the interface between the n-GaAsP layer 12 and the zinc diffused regions 16 results in a high internal absorption, and in addition no consideration is given to light output loss caused by total reflection.

The AlGaAs single heterojunction type light-emitting diode array shown in FIG. 5 was developed to overcome these drawbacks of the conventional GaAsP light-emitting diode array. With reference to FIG. 5, liquid-phase epitaxy (LPE) is used to form a p-Al$_x$Ga$_{1-x}$As layer 32 (10 microns thick; Zn=5×10$^{17}$cm$^{-3}$), an n-Al$_y$Ga$_{1-y}$As layer 34 (5 microns thick; Te=8×10$^{17}$cm$^{-3}$) and an n$^+$-GaAs layer 36 (0.1 microns thick; Sn=5×10$^{18}$cm$^{-3}$) on a p-GaAs substrate 30. For emitting light with a wavelength in the region of 720° nm, the aluminum composition is set at x=0.2, y°=°0.5.

Photolithography and chemical etching are used to form mesa-shaped light-emitting regions, with etching expanding about 1 micron into the p-Al$_x$Ga$_{1-x}$As layer 32. Following this formation of mesa-shaped light-emitting regions, the n-electrode 38 and p-electrode 40 are then formed by deposition, and the necessary portions of the n-electrode 38 and the n$^+$-GaAs layer 36 is removed by photolithography and wet etching. To complete the fabrication of the heterojunction light-emitting diode array, plasma-CVD is then used to form an antireflection SiN$_x$ layer 42.

Structurally, this is an array of conventional high-luminance LEDS. In this arrangement the effect of the heterojunction is to improve the injection efficiency, while at the same time energy attenuation caused by internal absorption is avoided by using the n-Al$_y$Ga$_{1-y}$As layer 34 which is transparent to the light emitted by the light-emitting p-Al$_x$Ga$_{1-x}$As layer 32, producing an external light output efficiency that is several times higher than that achievable with the homojunction light-emitting diode array of FIG. 4.

However, there are still problems with this conventional LED array arrangement. In particular, as described above, the very high refractive index of the light-emitting regions means that most of the light is reflected and therefore remains in the emission regions, keeping the external light output efficiency to a very low level. This is an inherent problem in a surface type light-emitting diode array.

An object of the present invention is therefore to provide a light-emitting diode array that offers an improved external light output efficiency without loss of reliability or reproducibility.

SUMMARY OF THE INVENTION

In the present invention this object is attained by a light-emitting diode array comprised of a multiplicity of light-emitting diodes arranged on a single substrate, each light-emitting diode having a light-emitting layer which emits light when subjected to carrier injection, and a light-emitting surface for external output of light from the light-emitting layer, wherein the light-emitting surface of each of the light-emitting diodes is provided with a multiplicity of projections which gives the light-emitting surface a non-uniform slope.

With the light-emitting diode array thus constituted in accordance with this invention, the angle of the light-emitting surface relative to the light-emitting layer is changed, providing a non-uniformity to the angle of light incident on the light-emitting surface, reducing the amount of light reflected by the light-emitting surface and thereby increasing the external light output amount.

BRIEF DESCRIPTION OF THE DRAWINGS

Further features of the invention, its nature and various advantages will become more apparent from the following detailed description taken in conjunction with the accompanying drawings in which.

DETAILED DESCRIPTION OF THE INVENTION

Figure 1:
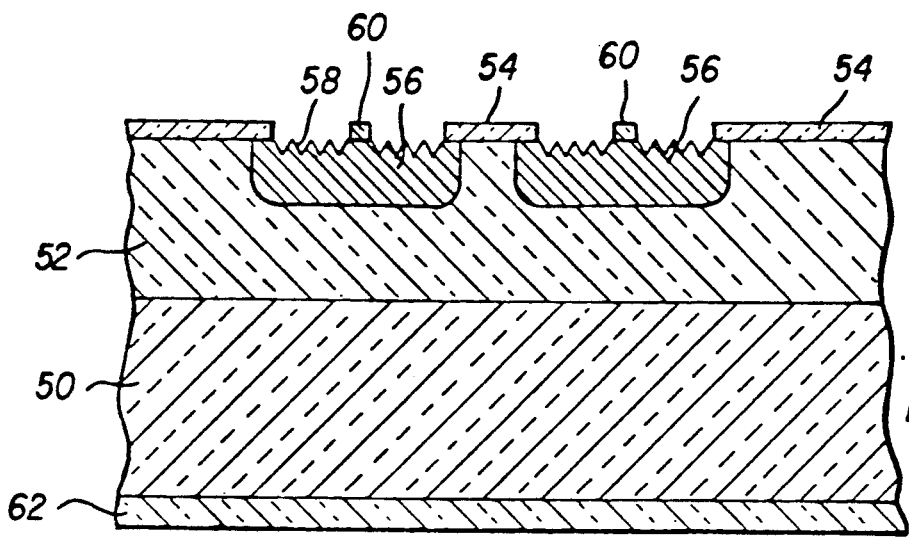
FIG. 1 is a cross-sectional view of a first embodiment of a light-emitting diode array according to the present invention.

FIG. 1 is a cross-sectional view of a first embodiment of a light-emitting diode array according to the present invention. For simplicity, only two light-emitting elements are shown.

With reference to the drawing, each light-emitting element is formed by using VPE to form an n-GaAsP buffer layer 52 (approximately 1.5 microns thick) on an n-GaAs substrate 50, followed by a $SiN_x$ masking layer 54 and a diffusion of zinc to form zinc diffused regions 56 each about 2.5 microns thick. The light-emitting element is constituted by the P-N junction between the n-GaAsP layer 52 and the zinc diffused regions 56. Photolithography and chemical etching are used to produce light-emitting mesas and to form projections on each light-emitting surface 58 at a pitch ranging from less than a micron to several microns. For simplicity, in FIG. 1 only a few of these projections are illustrated. In practice the pitch of the projections will depend on the size of the individual elements of the array and the size of the projections themselves.

The p-electrode 60 and n-electrode 62 are then formed. Although not illustrated, in some cases an anti-reflection $SiN_x$ layer is then formed on the substrate surface on which the p-electrode 60 is provided and this $SiN_x$ layer is then removed from the non-light-emitting element portions to form a p-electrode 58 bonding pad.

On the light-emitting diode array of the first embodiment thus fabricated according to the above process, mesa etching is used to form 45′ projections perpendicular to the [011] orientation. The resultant slope of the external light output surface of the wafer (i.e. the light-emitting surface 58) changes the incident angle on the light-emitting surface 58 of light from the zinc-diffused regions 56 and thereby makes it possible to achieve an external light output even at an angle at which all the light would previously have been reflected. The result is an approximately 1.8-fold improvement in the external light output efficiency compared with a conventional flat type light-emitting diode arrangement. Moreover, by using plasma etching to form the projections as concentric circles on the light-emitting surface 58, about a ten-fold improvement in output efficiency can be obtained.

Figure 2:
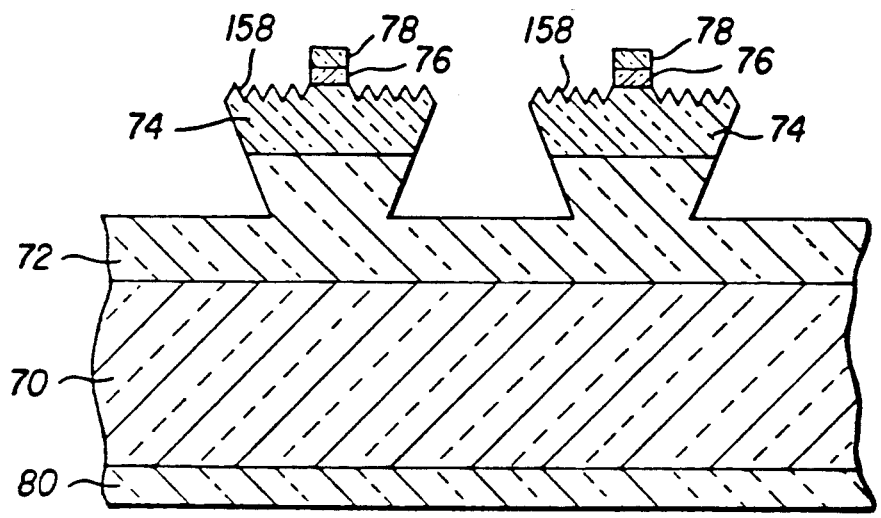
FIG. 2 is a cross-sectional view of a second embodiment of a light-emitting diode array according to the present invention.

FIG. 2 is a cross-sectional view of a second embodiment of the light-emitting diode array of this invention. As in the description of the first embodiment, for simplicity only two light-emitting elements are shown.

With reference to the drawing, liquid-phase epitaxy is used to form a $P-Al_xGa_{1-x}As$ layer 72 (10 microns thick; $Zn = 5 \times 10^{17} cm^{-3}$) on a p-GaAs substrate 70, followed by an $n-Al_yGa_{1-y}As$ layer 74 (5 microns thick; $Te = 5 \times 10^{17} cm^{-3}$) and an $n^+$-GaAs layer 76 (0.1 microns thick; $Sn = 5 \times 10^{18} cm^{-3}$). For emitting light with a wavelength in the region of 720° nm, an aluminum content of $x = 0.2$, $y° = °0.5$ is used.

Following this, n-electrode 78 and p-electrode 80 are formed by deposition and the unnecessary portions of the n-electrode 78 are removed by photolithography and wet etching and the $n^+$-GaAs layer 76 is selectively etched. After removal of the n-electrode 78, photolithography and chemical etching are used to form the light-emitting regions into mesas. The etching is extended about at least 1 micron into the $p-Al_xGa_{1-x}As$ layer 72. In the same way as in the first embodiment, etching is then used to form projections on the light-emitting surface 158 of the light-emitting regions.

Although the above arrangement is an AlGaAs single heterojunction LED array, projections can be formed on the light-extraction portion of the light-emitting elements, which is to say the light-emitting surface 158, thereby enabling the light output efficiency to be improved.

Figure 3:
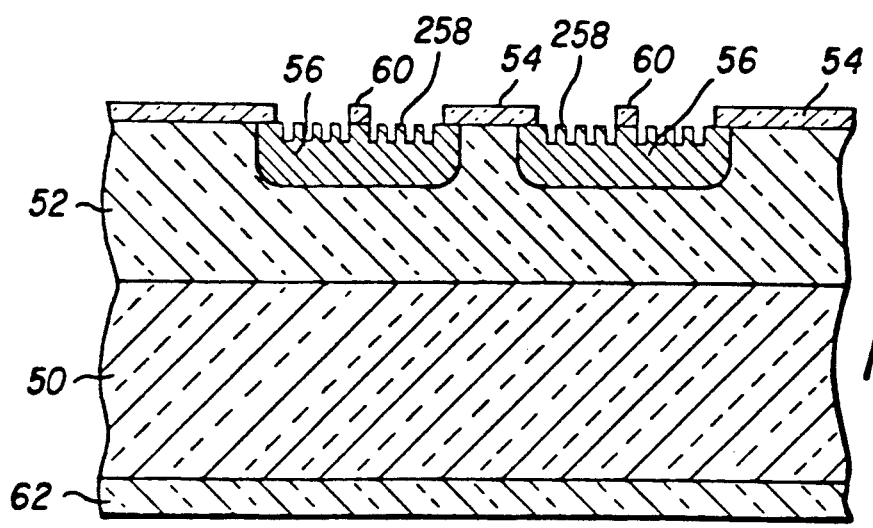
FIG. 3 is a cross-sectional view of a third embodiment of the light-emitting diode array.
Figure 4:
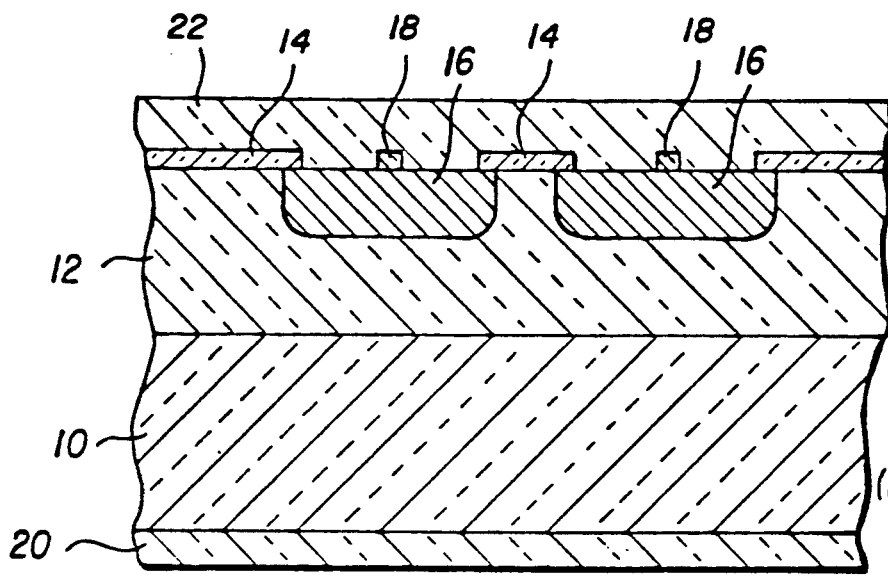
FIG. 4 is a cross-sectional view of a conventional homojunction type light-emitting diode array.
Figure 5:
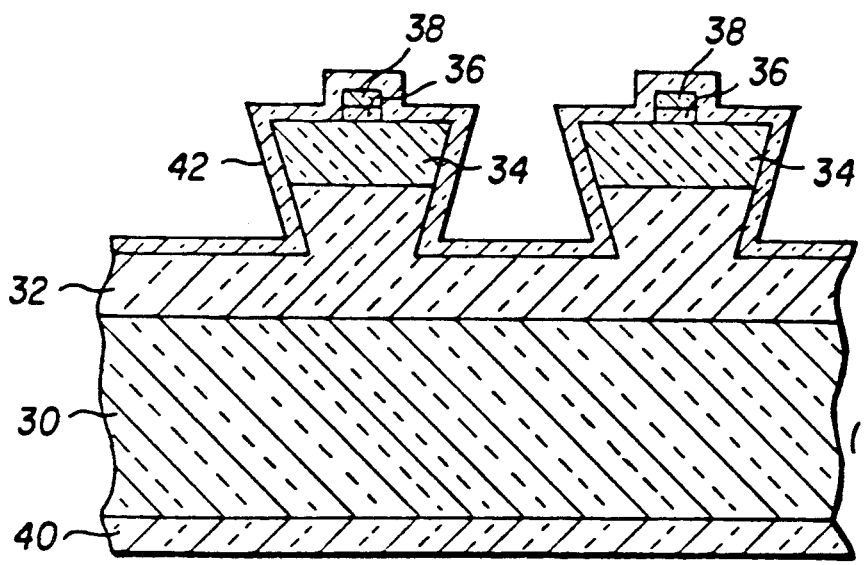
FIG. 5 is a cross-sectional view of a conventional single heterojunction type light-emitting diode array.

FIG. 3 is a cross-sectional view of a third embodiment of the light-emitting diode array of the invention. As before, for simplicity only two light-emitting elements are shown. Structural elements that are the same as those in FIG. 1 have been given the same reference numerals, and explanation of those elements are omitted here.

In this embodiment the projections on the light-emitting surface 258 are formed as vertical grooves. Reactive ion etching, for example, is used to form these grooves. These grooves have the same effect as the angled projections of the first two embodiments, the improvement of the light output efficiency.

The foregoing descriptions of each of the first, second and third embodiments of the light-emitting diode array have been made with reference to specific structures and compositions such as GaAsP and AlGaAs. However, it is to be understood that the invention is not limited thereto but may be applied to any light-emitting diode array having a light-emitting element surface that can be processed or shaped. Similarly, the invention is just as applicable to light-emitting diode arrays based on a homojunction or single or double heterojunction structure, or other heterojunction structure. Also, although the projections were described as being etched to a formed angle of 45°, the angle was chosen for the purpose of description and is not to be taken as limitative.

Finally, although the description of the three embodiments referred to the use of LPE and VPE to form the GaAsP and AlGaAs, other methods may be used such as MBE, LPCVD, MOCVD (OMVPE), GSMBE, CBE.

The light-emitting diode array according to the present invention, as described in the foregoing, produces a high light output efficiency, and is therefore capable of providing adequate light intensity for use as the image-formation light source of an LED printer or the like, and enables a printer thus equipped to produce high-quality output at high speed and low power consumption.

The invention has been described in detail with particular reference to certain preferred embodiments thereof, but it will be understood that variations and modifications can be effected within the spirit and scope of the invention

What is claimed is:

1. A light-emitting diode array comprised of a multiplicity of light-emitting diodes arranged on a single substrate, each light-emitting diode having a light-emitting layer which emits light when subjected to carrier injection, and a light-emitting surface for external output of light from the light-emitting layer, wherein the light-emitting surface of each of the light-emitting diodes is provided with a multiplicity of projections, each of said projections having two sides which are at the same angle to the light-emitting surface and having a pitch so as to reduce the amount of light reflected by the light emitting surface and thereby increase the output of emitted light.

2. The array of claim 1 wherein each light-emitting diode is of a heterojunction type.

3. The array of claim 1 wherein each light-emitting diode is of a homojunction type.

4. The array of claim 1 wherein the sides of the projections are at an angle of 45° with respect to the light-emitting surface.

5. The array of claim 1 wherein the sides of the projections are perpendicular to the light-emitting surface.

6. The array of claim 1 wherein the projections have a pitch ranging from less than one micron to several microns.

7. The array of claim 1 wherein the projections are arranged in concentric circles on the light emitting surface.

8. A light-emitting diode array comprised of a multiplicity of light-emitting diodes arranged on a single substrate, each light-emitting diode have a light-emitting layer which emits light when subjected to carrier injection, and a light-emitting surface for external output of light from the light-emitting layer wherein the light-emitting surface of each of the light-emitting diodes is provided with a multiplicity of projections extending in concentric circles on the light-emitting surface, the projections being selected to reduce the amount of light reflected by the light emitting surface and thereby increase the output of emitted light.

9. The array of claim 8 in which the array comprises a substrate of a semiconductor material of one conductivity type having a pair of opposed surfaces, a buffer layer of a semiconductor material of the one conductivity type on one of the surfaces of the substrate, spaced regions of the opposite conductivity type in the buffer layer, a separate electrode on the surface of each of the regions, an electrode on the other surface of the substrate and the projections are on the surface of the regions.

10. The array of claim 8 in which the array comprises a substrate of a semiconductor material of one conductivity type having a pair of opposed surfaces, a first layer of a semiconductor material of the one conductivity type on one of the surfaces of the substrate, the first layer having a multiplicity of mesas projecting therefrom, a second layer of a semiconductor material of the opposite conductivity type on each of the mesas of the first layer, a separate electrode on each of the second layers, an electrode on the other surface of the substrate and the projections are on the second layers.

11. The array of claim 7 in which the projections have sides which are at an angle of about 45° with respect to the light-emitting surface.

12. The array of claim 7 in which the projections have sides which are substantially perpendicular to the light-emitting surface.

* * * * *